United States Patent [19]

Aoai et al.

[11] Patent Number: 5,002,853
[45] Date of Patent: Mar. 26, 1991

[54] POSITIVE WORKING PHOTOSENSITIVE COMPOSITION

[75] Inventors: Toshiaki Aoai, Shizuoka; Teruo Nagano, Odawara, both of Japan

[73] Assignee: Fuji Photo Film Co., Ltd., Ashigara, Japan

[21] Appl. No.: 417,496

[22] Filed: Oct. 5, 1989

[30] Foreign Application Priority Data

Oct. 7, 1988 [JP] Japan ................................. 63-253264

[51] Int. Cl.⁵ ...................... G03F 7/039; C08F 12/32; C08F 128/02
[52] U.S. Cl. ................................. 430/281; 430/326; 430/286; 430/287; 526/287; 526/284; 526/280; 526/266; 522/26; 522/34; 522/40; 522/47
[58] Field of Search ............... 526/287, 284, 280, 266; 430/270, 286, 287, 281; 522/26, 34, 40, 47

[56] References Cited

U.S. PATENT DOCUMENTS 4,425,424  1/1984  Altland et al. ..................... 430/270
4,957,988  9/1990  Irving et al. ..................... 526/287 X

FOREIGN PATENT DOCUMENTS 0166682  1/1986  European Pat. Off. ............ 430/270

Primary Examiner—Cynthia Hamilton
Attorney, Agent, or Firm—Burns, Doane, Swecker & Mathis

[57] ABSTRACT

The present invention relates to a positive working photosensitive composition having an improved sensitivity due to the use of a sensitizer and having an excellent incandescent light safety. This composition comprises at least 1 molar % of a structural unit derived from at least one of monomers having the following general formulae:

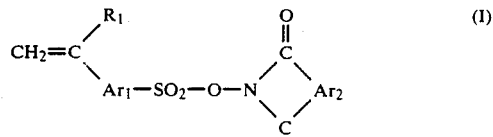

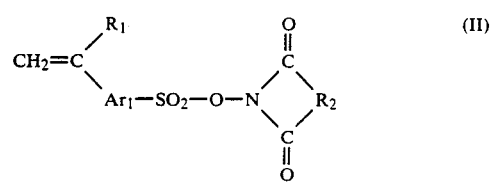

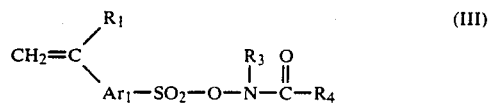

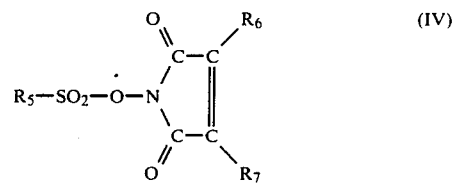

wherein:

$R_1$ represents a hydrogen atom, an alkyl group or a substituted alkyl group, $R_2$ represents a divalent alkylene group or a substituted divalent alkylene group, $R_3$, $R_4$ and $R_5$ may be the same as or different from each other and each represents an alkyl group, a substituted alkyl group, an aryl group or a substituted aryl group, $R_6$ and $R_7$ may be the same as or different from each other and each represents a hydrogen atom, an alkyl group, a substituted alkyl group, an aryl group or a substituted aryl group, $Ar_1$ represents a single bond or $Ar_2$, and $Ar_2$ represents a divalent arylene group or a substituted divalent arylene group.

20 Claims, No Drawings

POSITIVE WORKING PHOTOSENSITIVE COMPOSITION

BACKGROUND OF THE INVENTION

1. Field of the Invention

The present invention relates to a new positive working photosensitive composition suitable for production of lithographic printing plates, proofs or multicolor printings, drawings for an overhead projector, integrated circuits, and photomasks.

2. Description of the Prior Art o-Quinone diazide compounds have been known as so-called positive working photosensitive materials which are solubilized by activating rays. They have been widely used for lithographic printing plates, photoresists, etc. These o-quinone diazide compounds are described in many publications, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443.

The o-quinone diazide compounds are decomposed by irradiation with activating rays to become a five-membered carboxylic acid which is soluble in an alkali. However, they have a defect that their photosensitivity is yet insufficient, because the photochemical sensitization of them is difficult and their quantum yield does not essentially exceed 1. Further, the wave length for the sensitization usable is limited and, therefore, usable light sources are limited, namely the acceptability of light sources is much limited. Accordingly, it is difficult to use them in the light of an incandescent lamp for a long period of time (incandescent light safty lacks). Another problem is that their absorbance of a deep UV region of about 200 to 300 nm is high and therefore they are unsuitable when they are used to improve their resolving power with a light or low wave length.

Although various processes have been tried for improving the photosensitivity of a photosensitive composition containing an o-quinone diazide compound under these circumstances, it has been very difficult to improve the photosensitivity while the developability is kept good. These processes are described in, for example, Japanese Patent Publication for Opposition Purpose (hereinafter referred to as 'J. P. KOKOKU') No. 48-12242, Japanese Patent Unexamined Published Application (hereinafter referred to as 'J. P. KOKAI') No. 52-40125 and U.S. Pat. No. 4,307,173.

Recently, several positive working photosensitive compositions free of o-quinone diazide compounds have been proposed. Among them, proposed was a polymer compound having an o-nitrocarbinol ester group described in, for example, J. P. KOKOKU No. 56-2696. However, its photosensitivity is also yet insufficient for the same reasons as those of the o-quinone diazide compounds. Also, proposed is a compound which becomes sulfonic acid upon exposure as described in J. P. KOKAI Nos. 60-260947 and 62-36404. However, these compounds were not able to be easily produced.

SUMMARY OF THE INVENTION

An object of the present invention is to provide a positive working photosensitive composition, sensitivity of which can be improved with a sensitizer.

Another object of the present invention is to provide a new positive working photosensitive composition having an excellent incandescent light safety.

After intensive investigations made for the purpose of attaining the above-described objects, the inventors have found out a new photo-solubilizable composition. The present invention has been completed on the basis of this finding.

Namely, the present invention relates to a positive working photosensitive composition containing a polymeric compound comprising at least 1 molar % of a structural unit derived from at least one of the monomers of the following general formulae (I), (II), (III) and (IV):

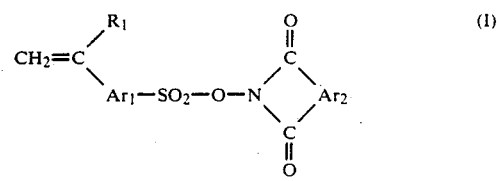

(I)

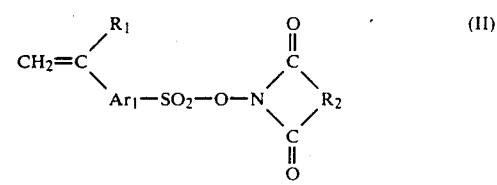

(II)

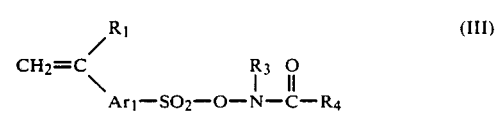

(III)

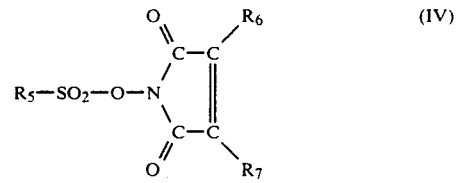

(IV)

DETAILED DESCRIPTION OF THE INVENTION

Monomers

In the above formulae, $R_1$ represents a hydrogen atom, an alkyl group or a substituted alkyl group.

Preferred examples of $R_1$ include a hydrogen atom and alkyl groups having 1 to 3 carbon atoms which may be substituted with a halogen atom such as a chlorine atom or with an alkoxy group having 1 to 6 carbon atoms such as a methoxy group. Preferably, $R_1$ is a hydrogen atom, a methyl group or a chloromethyl group.

$R_2$ represents a substituted or unsubstituted divalent alkylene group. The alkylene group $R_2$ may be straight chain, branched or cyclic. It is preferably a straight chain alkylene group. The alkylene groups are preferably those having 1 to 18 carbon atoms such as methylene, ethylene, butylene and octylene groups. The substituted alkylene group $R_2$ is the above-described alkylene group which is further substituted with a halogen atom such as a chlorine atom, an alkoxy group having 1 to 6 carbon atoms or an aryloxy group having 6 to 10 carbon atoms.

$R_3$, $R_4$ and $R_5$ may be the same as or different from one another and each represents an alkyl group, a substituted alkyl group, an aryl group or a substituted aryl group. The alkyl groups are straight chain, branched and/or cyclic alkyl groups having preferably about 1 to 10 carbon atoms. They include, for example, methyl, ethyl, propyl, butyl, hexyl, octyl, decyl, isopropyl, isobutyl, tert-butyl, 2-ethylhexyl and cyclohexyl groups. The substituted alkyl groups as $R_3$, $R_4$ and $R_5$ are the above-described alkyl groups which are substituted with a halogen atom such as a chlorine atom, an alkoxy group having 1 to 6 carbon atoms such as a methoxy group, an aryl group such as a phenyl group or an aryloxy group such as a phenoxy group. They include, for example, monochloromethyl, dichloromethyl, trichloromethyl, bromomethyl, 2-chloroethyl, 2-bromoethyl, 2-methoxyethyl, 2-ethoxyethyl, phenylmethyl, naphthylmethyl and phenoxymethyl groups. The aryl groups as $R_3$, $R_4$ and $R_5$ are preferably monocyclic or bicyclic aryl groups such as phenyl, α-naphthyl and β-naphthyl groups. The substituted aryl groups as $R_3$, $R_4$ and $R_5$ are the above-described aryl groups which are substituted with an alkyl group having 1 to 6 carbon atoms such as a methyl or ethyl group, an alkoxy group having 1 to 6 carbon atoms such as a methoxy or ethoxy group, a halogen atom such as a chlorine atom, a phenyl group, a carboxy group, or a cyano group. They include, for example, 4-chlorophenyl, 2-chlorophenyl, 4-bromophenyl, 4-phenylphenyl, 4-methylphenyl, 2-methylphenyl, 4-ethylphenyl, 4-methoxyphenyl, 2-methoxyphenyl, 4-ethoxyphenyl, 2-carboxyphenyl, 4-cyanophenyl, 4-methyl-1-naphthyl, 4-chloro-1-naphthyl, 6-chloro-2-naphthyl or 4-bromo-2-naphthyl group.

$R_6$ and $R_7$ may be the same as or different from each other and each represents a hydrogen atom, an alkyl group, a substituted alkyl group, an aryl group or a substituted aryl group. They are preferably a hydrogen atom, a straight chain, branched or cyclic alkyl group having 1 to 10 carbon atoms or a monocyclic or bicyclic aryl group. The alkyl and aryl groups may be unsubstituted or substituted with a halogen atom such as a chlorine atom, an alkyl group having 1 to 6 carbon atoms such as a methyl or ethyl group, an alkoxy group having 1 to 6 carbon atoms such as methoxy or ethoxy group or a nitrile group. They include, for example, a hydrogen atom and methyl, ethyl, butyl, hexyl, phenyl, 4-chlorophenyl, 4-methoxyphenyl, 4-methylphenyl, α-naphthyl and β-naphthyl groups.

$Ar_1$ represents a single bond or $Ar_2$. $Ar_2$ represents a divalent arylene group or a substituted arylene group. The arylene group is preferably a monocyclic or bicyclic arylene group such as a phenylene or naphthylene group. The substituted arylene groups or $Ar_1$ and $Ar_2$ are the above-described arylene groups which are substituted with an alkyl group having 1 to 6 carbon atoms such as a methyl or ethyl group, an alkoxy group having 1 to 6 carbon atoms such as a methoxy or ethoxy group, a halogen atom such as a chlorine or bromine atom, a phenyl group, as carboxy group or a cyano group. They include, for example, chlorophenylene, bromophenylene, phenylphenylene, methylphenylene, ethylphenylene, methoxyphenylene, ethoxyphenylene, cyanophenylene, methylnaphthylene, chloronaphthylene and bromonaphthylene groups.

The compound of the present invention represented by the general formula (I), (II) or (III) can be produced by reacting the monomer of the general formula (V), (VI) or (VII):

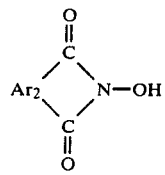

(V)

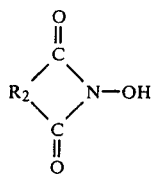

(VI)

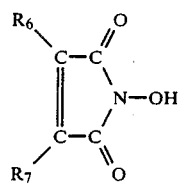

(VII)

wherein $Ar_2$, $R_2$, $R_6$ and $R_7$ are as defined above for the general formulae (I), (II) and (IV) which is prepared by a process described in G. F. Jaubert, Ber., 28, 360 (1985), a process described in D. E. Ames et al., J. Chem. Soc., 3518 (1955) or a process described in M. A. Stolberg et al., J. Amer. Chem. Soc., 79, 2615 (1957), with an organic sulfonychloride of the following general formula (in case of the formulae (I) and (II)):

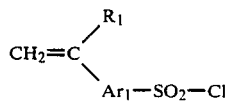

wherein $Ar_1$ and $R_1$ are the same as those of the general formulae (I), (II) and (IV), or with an organic sulfonylchloride of the following general formula (in case of the formula (IV)):

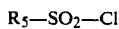

wherein $R_5$ is the same as that of the general formula (IV) under a basic condition by, for example, a process described in L. Bauer et al., J. Org. Chem., 24, 1293 (1959).

The monomer of the present invention represented by the general formula (III) can be produced by reacting a compound of the general formula (VIII):

wherein $R_3$ and $R_4$ are the same as those of the general formula (III) which is prepared by a process described in E. E. Smissman et al., Journal of Organic Chemistry, Vol. 37, 1847 to 1849 (1972), a process described in H. E. Baumgarten et al. Journal of Organic Chemistry, Vol. 30, 1203 to 1206 (1965), a process described in S. A. Martlin et al., Journal of Chemical Society, Perkin I, 2481 to 2487 (1979) or a process described in P. G. Mattingly et al. Journal of Organic Chemistry, Vol. 45, 410 to 415 (1980), with an organic sulfonylchloride of the general formula:

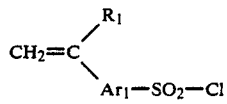
wherein $Ar_1$ and $R_1$ are the same as those of the general formula (III) in the same manner as that described above.
Examples of the compounds of the general formulae (I), (II), (III) and (IV) usable in the present invention are as follows:
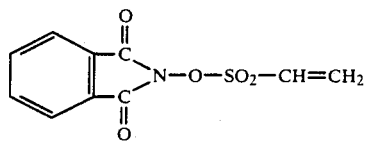
(I-1)
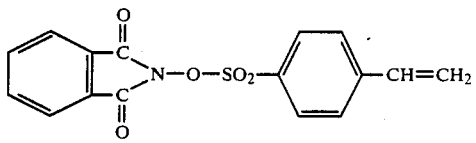
(I-2)
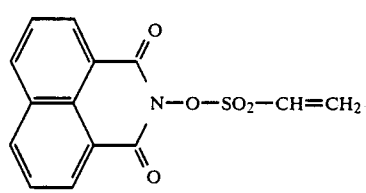
(I-3)
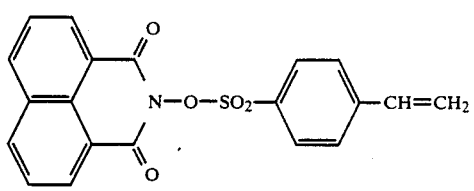
(I-4)
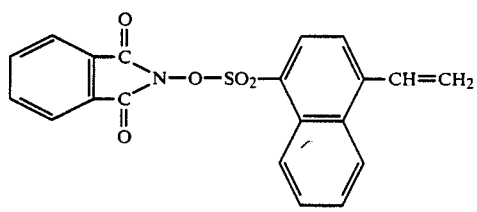
(I-5)
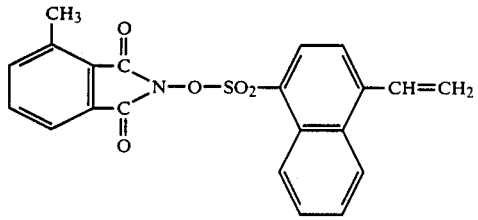
(I-6)
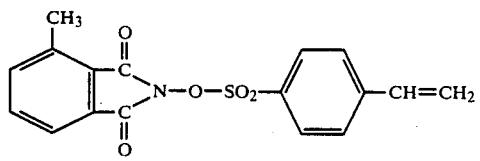
(I-7)
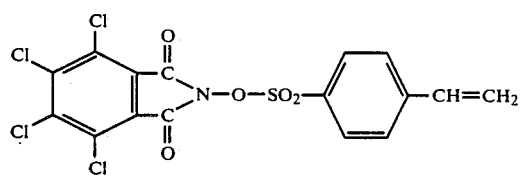
(I-8)

-continued
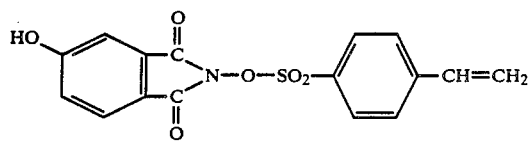
(I-9)
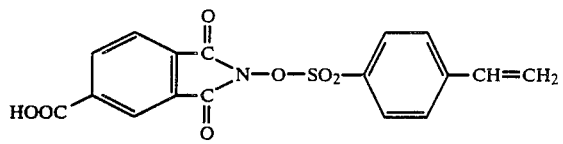
(I-10)
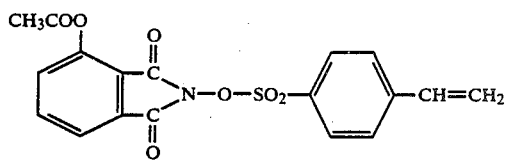
(I-11)
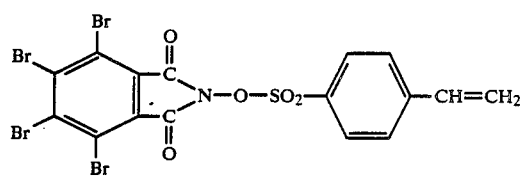
(I-12)
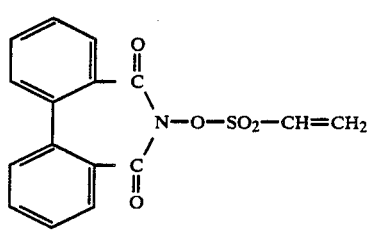
(I-13)
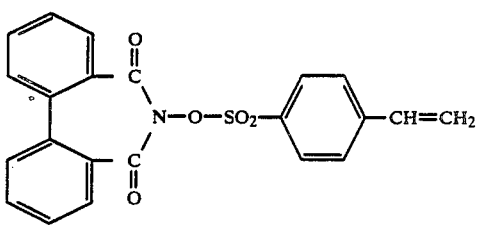
(I-14)
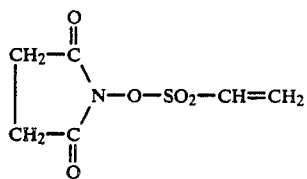
(II-1)
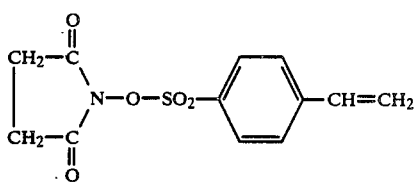
(II-2)

-continued
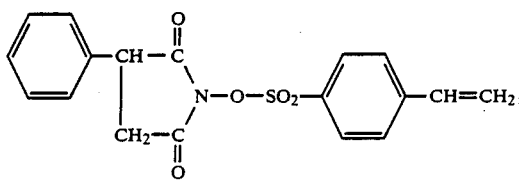
(II-3)
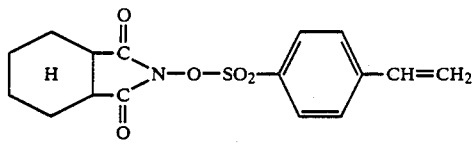
(II-4)
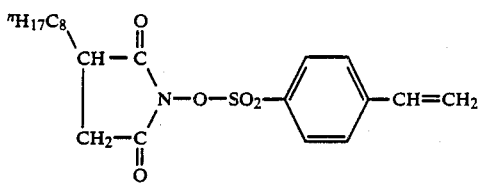
(II-5)
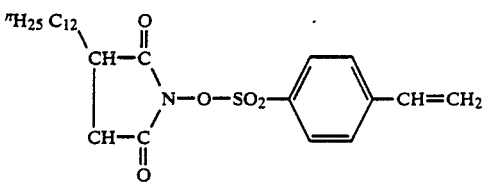
(II-6)
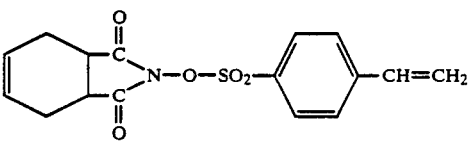
(II-7)
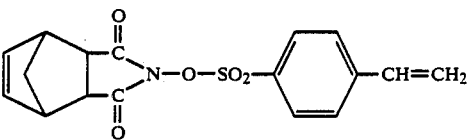
(II-8)
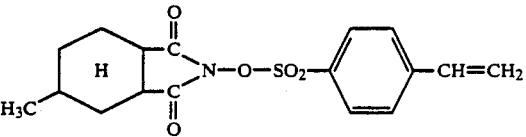
(II-9)
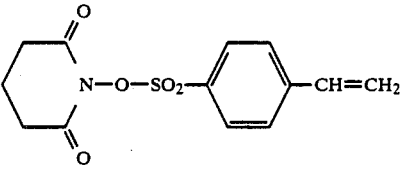
(II-10)
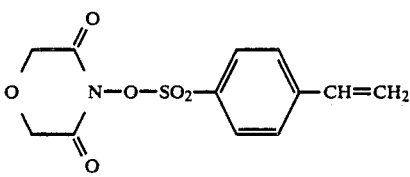
(II-11)
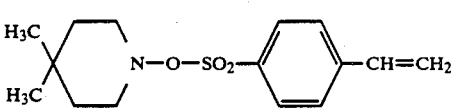
(II-12)

-continued
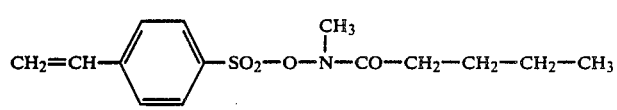 (III-1)
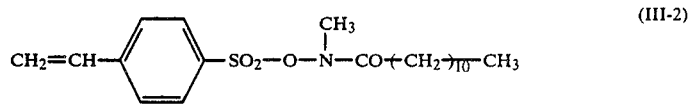 (III-2)
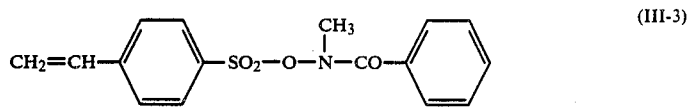 (III-3)
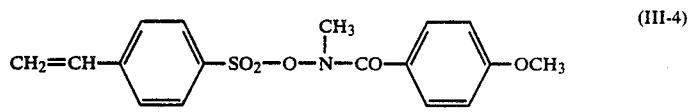 (III-4)
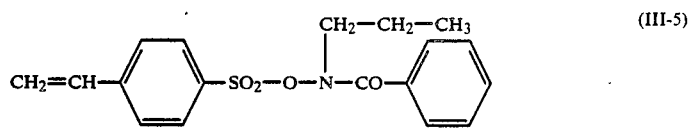 (III-5)
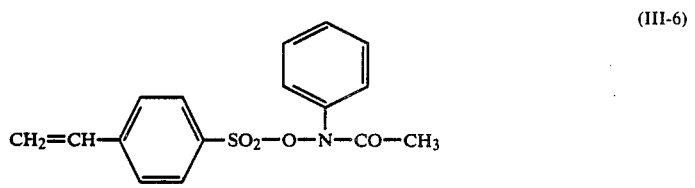 (III-6)
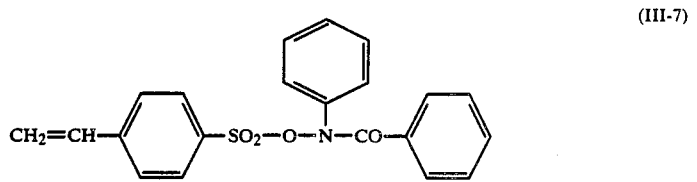 (III-7)
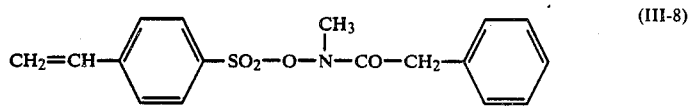 (III-8)
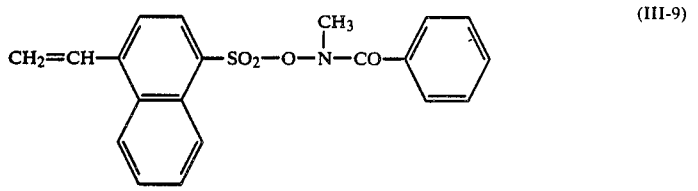 (III-9)
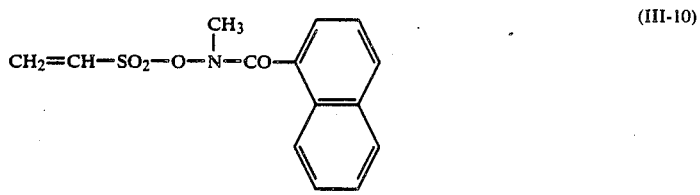 (III-10)

-continued
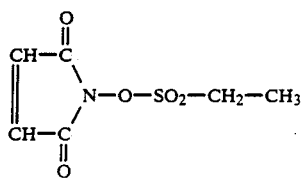 (IV-1)
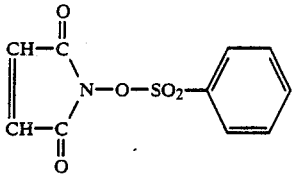 (IV-2)
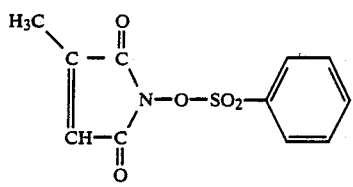 (IV-3)
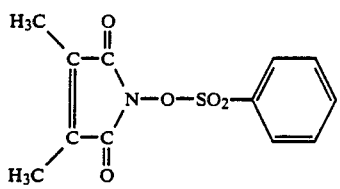 (IV-4)
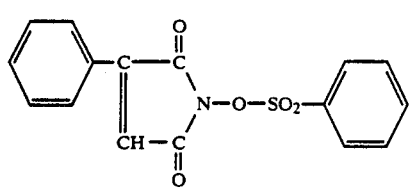 (IV-5)
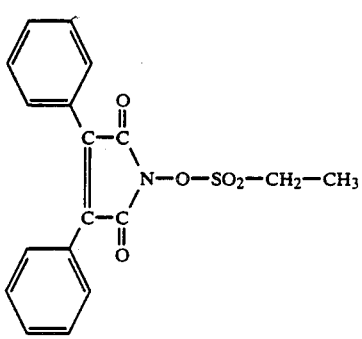 (IV-6)
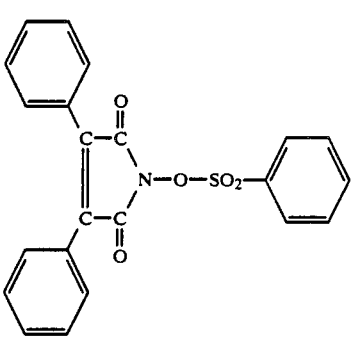 (IV-7)

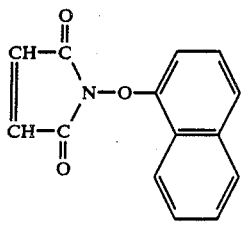

(IV-8)

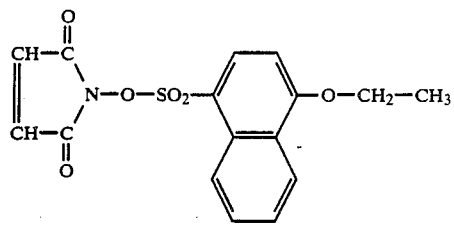

(IV-9)

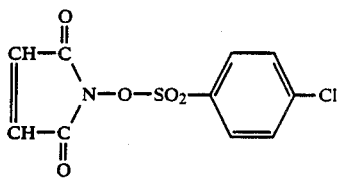

(IV-10)

Other monomers

Although the polymeric compound comprising at least 1 molar % of a structural unit derived from at least one of the monomers represented by the general formulae (I), (II), (III) and (IV) is usable in the form of homopolymer of the monomer of the general formula (I), (II), (III) or (IV), it is more preferable to use it in the form of copolymer (at least bipolymer) of at least one of the monomers (I)~(IV) with at least one compound having a polymerizable ethylenically unsaturated bond. In the latter case, the amount of the structural unit derived from the monomer of the general formula (I), (II), (III) or (IV) is preferably 5 to 90 molar %, more preferably 10 to 80 molar %.

The preferred compounds having polymerizable ethylenically unsaturated bond are those having an addition-polymerizable unsaturated bond selected from the group consisting of acrylic esters, acrylamides, methacrylic esters, methacrylamides, allyl compounds, vinyl ethers, vinyl esters, styrenes and crotonic esters. Examples of them include acrylic esters such as alkyl acrylates in which the alkyl group has preferably 1 to 10 carbon atoms (for example, methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate) and aryl acrylates (for example, phenyl acrylate); methacrylic esters such as alkyl methacrylates in which the alkyl group has preferably 1 to 10 carbon atoms (for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate) and aryl methacrylates (for example, phenyl methacrylate, cresyl methacrylate and naphthyl methacrylate); acrylamides such as acrylamide, N-alkylacrylamides in which the alkyl group has 1 to 10 carbon atoms (the alkyl groups are, for example, methyl, ethyl, propyl, butyl, t-butyl, heptyl, octyl, cyclohexyl, benzyl, hydroxyethyl and benzyl groups), N-arylacrylamides (the aryl groups are, for example, phenyl, tolyl, nitrophenyl, naphthyl, cyanophenyl and hydroxyphenyl groups), N,N-dialkylacrylamides in which the alkyl group has 1 to 10 carbon atoms (the alkyl groups are, for example, methyl, ethyl, butyl, isobutyl, ethylhexyl and cyclohexyl groups), N,N-arylacrylamides (in which the aryl group is, for example, phenyl group), N-methyl-N-phenylacrylamide, N-hydroxyethyl-N-methylacrylamide and N-2-acetamidoethyl-N-acetylacrylamide; methacrylamides such as methacrylamide, N-alkylmethacrylamides in which the alkyl group has 1 to 10 carbon atoms (the alkyl groups are, for example, methyl, ethyl, t-butyl, ethylhexyl, hydroxyethyl and cyclohexyl groups), N-arylmethacrylamides (the aryl groups are, for example, phenyl and hydroxyphenyl groups), N-N-dialkylmethacrylamides (the alkyl groups are, for example, ethyl, propyl and butyl groups), N,N-diarylmethacrylamides (the aryl group is, for example, phenyl group), N-hydroxyethyl-N-methylmethacrylamide, N-methyl-N-phenylmethacrylamide and N-ethyl-N-phenylmethacrylamide; allyl compounds such as allyl esters (for example, allyl acetate, allyl caproate, allyl caprylate, allyl laurate, allyl palmitate, allyl stearate, allyl benzoate, allyl acetoacetate and allyl lactate) and allyloxyethanol; vinyl ethers such as alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether), vinyl aryl ethers (for example, vinyl phenyl ether, vinyl tolyl ether, vinyl chlorophenyl ether, vinyl 2,4-dichlorophenyl ether, vinyl naphthyl ether and vinyl anthranyl ether); vinyl esters such as vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutylate, vinyl cyclohexylcarboxylate, vinyl benzoate, vinyl salicylate, vinyl chlorobenzoate, vinyl tetrachlorobenzoate and vinyl naphthoate; styrenes such as styrene, alkylstyrenes (for example, methylstyrene, dimethylstyrene, trimethylstyrene, ethylstyrene, diethylstyrene, isopropylstyrene, butylstyrene, hexylstylene, cyclohexylstyrene, decylstyrene, benzylstyrene, chloromethylstyrene, trifluoromethylstyrene, ethoxymethylstyrene and acetoxymethylstyrene), alkoxystyrenes (for example, methoxystyrene, 4-methoxy-3-methylstyrene and dimethoxystyrene), halogenostyrenes (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene); crotonic esters such as alkyl crotonates (for example, butyl crotonate, hexyl crotonate and glycerol monocrotonate); dialkyl itaconates (for example, dimethyl itaconate, diethyl itaconate and dibutyl itaconate); dialkyl maleate or fumarate (for example, dimethyl maleate and dibutyl fumarate); acrylic acid, methacrylic acid, maleimide, acrylonitrile and methacrylonitrile. Further, addition-polymerizable unsaturated compounds copolymerizable with the compounds of the above general formula (I), (II), (III) or (IV) are also usable.

The weight average molecular weight of the polymeric compound used in the present invention is at least 1000, preferably 5,000 to 1,000,000.

The amount of the polymeric compound contained in the photosensitive composition is 1 to 100 wt. %, preferably 3 to 70 wt. % and more preferably 5 to 50 wt. %, based on the total solid content of the photosensitive composition.

Alkali-soluble polymers

The positive working photosensitive composition of the present invention can contain only the polymeric compound comprising at least 1 molar % of a structural unit derived from at least one monomer of the general formula (I), (II), (III) or (IV). However, it is preferable to use the polymeric compound in combination with an alkali-soluble polymer.

The alkali-soluble polymers usable in the present invention are preferably those having an acidic hydrogen atom of a pKa of 11 or below, such as a phenolic hydroxyl group, carboxylic acid group, sulfonic acid group, imido group, sulfonamido group, N-sulfonylamido group, N-sulfonylurethane group or active methylene group. Suitable alkali-soluble polymers include, for example, novolak-type phenolic resins such as phenol/formaldehyde resin, o-cresol/formaldehyde resin, m-cresol/formaldehyde resin, p-cresol/formaldehyde resin and copolycondensates of them. It is more preferable to use the phenolic resin in combination with a phenol/formaldehyde or cresol/formaldehyde condensate substituted with an alkyl group having 3 to 8 carbon atoms such as t-butylphenol/formaldehyde resin. In addition, polymers comprising, as a comonomer, a phenolic hydroxy group-having monomer such as N-(4-hydroxyphenyl)methacrylamide and a polymer of p-hydroxystyrene are also usable.

Further, polymers of carboxyl group-having monomers such as acrylic acid and methacrylic acid, carboxyl group-having polyvinylacetal resin described in J. P. KOKAI No. 61-267042 and carboxyl group-having polyurethane resin described in J. P. KOKAI No. 63-124047 are also preferably usable.

In addition, polymers comprising N-(4-sulfamoylphenyl) methacrylamide, N-phenylsulfonyl methacrylamide or maleimide as a comonomer, and polymers having an active methylene group described in J. P. KOKAI No. 63-127237 are also usable.

These alkali-soluble polymers can be used either singly or as a mixture of two or more of them. The amount of the alkali-soluble polymer is 30 to 99 wt. %, preferably 50 to 97 wt. %, based on the total solid content of the photosensitive composition.

Other additives

The positive working photosensitive composition of the present invention can contain, if necessary, a dye, pigment, plasticizer and a compound (sensitizer) effective for accelerating the photolysis of the structural unit derived from the monomer of the general formula (I), (II), (III) or (IV).

The sensitizers include, for example, benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino) benzophenone and benzanthrone. Among these compounds, the Michler's ketone is particularly preferable.

Preferred sensitizers usable in the present invention further include compounds of the following general formula (IX) described in J. P. KOKOKU No. 51-48516:

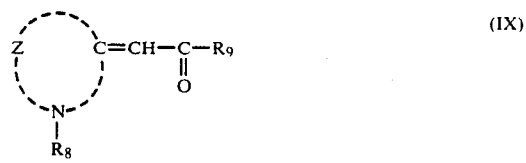

wherein $R_8$ represents an alkyl group (such as a methyl, ethyl or propyl group) or a substituted alkyl group (such as a 2-hydroxyethyl, 2-methoxyethyl, carboxymethyl or 2-carboxyethyl group), $R_9$ represents an alkyl group (such as a methyl or ethyl group) or an aryl group (such as a phenyl, p-hydroxyphenyl, naphthyl or thienyl group), and Z represents a non-metallic atomic group necessary for forming a nitrogen-containing heterocyclic ring of an ordinary cyanine dye such as a benzothiazole (for example, benzothiazole, 5-chlorobenzothiazole or 6-chlorobenzothiazole), a naphthothiazole (for example, α-naphthothiazole or β-naphthothiazole), a benzoselenazole (for example, benzoselenazole, 5-chlorobenzoselenazole or 6-methoxybenzoselenazole), a naphthoselenazole (for example, α-naphthoselenazole or β-naphthoselenazole), a benzoxazole (for example, benzoxazole, 5-methylbenzoxazole or 5-phenylbenzoxazole) or naphthoxazole (for example, α-naphthoxazole or β-naphthoxazole).

The compounds of the general formula (IX) have chemical structures having a combination of Z, $R_8$ and $R_9$. Various compounds of the general formula (IX) are known. Therefore, the compound of the general formula (IX) is suitably selected from the known compounds.

Preferred sensitizers usable in the present invention include those described in U.S. Pat. No. 4,062,686 such as 2-[bis(2-furoyl) methylene]-3-methylbenzothiazoline, 2-[bis(2-thenoyl)methylene]-3-methylbenzothiazoline and 2-[bis(2-furoyl)methylene]-3-methylnaphtho[1,2-d]thiazoline.

The molar ratio of the sensitizer to the structural unit derived from the monomer of the general formula (I), (II), (III) or (IV) is 0.01/1 to 5/1, preferably 0.1/1 to 2/1.

Dyes can be used as a colorant. Preferred dyes are oil-soluble dyes and basic dyes. Examples of them include Oil Yellow #101, Oil Yellow #130, Oil Pink #312, Oil Green BG, Oil Blue BOS, Oil Blue #603, Oil Black BY, Oil Black BS and Oil Black T-505 (products of Orient Kagaku Kogyo Co.), Crystal Violet (CI 42555), Methyl Violet (CI 142535), Rhodamine B (CI 45170B), Malachite Green (CI 42000) and Methylene Blue (CI 52015).

The composition of the present invention can contain also a cyclic acid anhydride for further increasing the sensitivity, a printing-out agent for forming a visible image immediately after the exposure, and a filler. The cyclic acid anhydrides include, for example, phthalic anhydride, tetrahydrophthalic anhydride, hexahydrophthalic anhydride, 3,6-endoxy-Δ⁴-tetrahydrophthalic anhydride, tetrachlorophthalic anhydride, maleic anhydride, chloromaleic anhydride, α-phenylmaleic anhydride, succinic anhydride and pyromellitic acid as described in U.S. Pat. No. 4,115,128. The sensitivity can be increased to at most 3-folds by incorporating 1 to 15 wt. %, based on the total composition, of the cyclic acid anhydride. The typical example of the printing-out agent for forming the visible image immediately after the exposure is a combination of a sensitive compound which releases an acid upon exposure with an organic dye capable of forming a salt. Examples of them include a combination of an o-naphthoquinone diazide-4-sulfonyl halide with a salt-forming organic dye as described in J. P. KOKAI Nos. 50-36209 and 53-8128 and a combination of a trihalomethyl compound with a salt-forming organic dye, as described in J. P. KOKAI Nos. 53-36223 and 54-74728.

Solvents

The positive working photosensitive composition of the present invention is dissolved in a solvent in which all the components are soluble and the solution is applied to a support. The solvents usable herein include, for example, ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 1-methoxy-2-methoxyethyl acetate, 1-methoxy-2-propyl acetate, methyl lactate, ethyl lactate, N,N-dimethylacetamide, N,N-dimethylformamide, tetramethylurea, N-methylpyrrolidone, dimethyl sulfoxide, sulfolane, Γ-butyrolactone, toluene and ethyl acetate. These solvents are used either singly or in the form of a mixture.

The concentration of the solvent in the composition (total solid components including the additives) is 2 to 50 wt. %.

The amount of the composition to be applied varies depending on the use. For example, when it is used for the production of a photosensitive lithographic plate, the amount thereof is preferably 0.5 to 3.0 g/m² (in terms of solid). As the amount of the applied composition is reduced, the photosensitivity is increased, but the properties of the photosensitive film become poor.

Production of lithographic printing plates

The supports used for the production of the lithographic printing plates using the positive working photosensitive composition of the present invention include, for example, paper, paper laminated with a plastic (such as polyethylene, polypropylene or polystyrene), metal plates such as aluminum (including its alloys), zinc and copper plates, plastic films such as cellulose diacetate, cellulose triacetate, cellulose propionate, cellulose acetate, cellulose acetate buryrate, cellulose nitrate, polyethylene terephthalate, polyethylene, polystyrene, polypropylene, polycarbonate and polyvinyl acetal films, and paper and plastics laminated with the above-described metal or on which such a metal is vapor-deposited. Among them, the aluminum plate is particularly preferred, because its dimensional stability is quite high and it is inexpensive. Further, composite sheets comprising a polyethylene terephthalate film bonded to an aluminum sheet as described in J. P. KOKOKU No. 48-18327 are also preferred. The surface of the aluminum plate is grained by a mechanical method such as wire brush graining method, brush graining method wherein the surface is roughened with a nylon brush while a slurry of abrasive particles is poured thereon, ball graining method, liquid honing method or a buff graining method; a chemical graining method wherein HF, AlCl₃ or HCl is used as an etchant; an electrolytic graining method wherein nitric acid or hydrochloric acid is used as an electrolyte; or a composite graining method wherein these surface-roughening methods are combined. Then, the surface of the aluminum plate is etched, if necessary, with an acid or alkali. It is then subjected to anodic oxidation with a direct current or alternating current in sulfuric acid, phosphoric acid, oxalic acid, boric acid, chromic acid, sulfamic acid or a mixture of them to form a firm passive film on the aluminum surface. Although the aluminum surface is made hydrophilic by the passive film thus formed, it is particularly preferable to subject it to an additional treatment for further improving the hydrophilic property, if necessary. The treatment includes a treatment with a silicate such as sodium silicate or potassium silicate described in U.S. Pat. Nos. 2,714,066 and 3,181,461, a treatment with potassium fluorozirconate described in U.S. Pat. No. 2,946,638, a treatment with a phosphomolybdate described in U.S. Pat. No. 3,201,247, a treatment with an alkyl titanate described in British Patent No. 1,108,559, a treatment with a polyacrylic acid described in German Patent No. 1,091,433, a treatment with a polyvinylphosphonic acid described in German Patent No. 1,134,093 and British Patent No. 1,230,447, a treatment with phosphonic acid described in J. P. KOKOKU No. 44-6409, a treatment with phytic acid described in U.S. Pat. No. 3,307,951, a composite treatment with a hydrophilic organic polymer compound and a divalent metal described in J. P. KOKAI Nos. 58-16893 and 58-18291 or an undercoating treatment with a water-soluble polymer having a sulfonic acid group described in J. P. KOKAI NO. 59-101651. Another treatment for improving the hydrophilic property is a silicate electrodeposition method described in U.S. Pat. No. 3,658,662.

It is also preferable to conduct a sealing treatment after the graining treatment and anodic oxidation. The sealing treatment is conducted by immersing the plate in hot water or a hot aqueous solution of an inorganic salt or an organic salt or by using a steam bath.

Activating rays

The activating ray sources usable in the present invention include, for example, mercury lamp, metal halide lamp, xenon lamp, chemical lamp or carbon arc lamp. Photoresist light sources include g-rays (monochromatic light of 436 nm), i-rays (monochromatic light of 365 nm) and Deep-UV rays. Further, a scanning exposure method using a high-density energy beam (laser beam or electron rays) can also be employed in the present invention. The laser beams include, for example, helium/neon laser, argon laser, krypton ion laser, helium/cadmium laser and KrF excimer laser.

Developers

The developer for the positive working photosensitive composition of the present invention is preferably an aqueous solution of an inorganic alkali such as sodiuim silicate, potassium silicate, sodium hydroxide, potassium hydroxide, lithium hydroxide, sodium tertiary phosphate, disodium hydrogenphosphate, ammonium tertiary phosphate, diammonium hydrogenphosphate, sodium metasilicate, sodium hydrogencarbonate or aqueous ammonia or an organic alkali such as an OH salt of tetraalkylammonium. The amount of the developer is such that the concentration thereof is 0.1 to 10 wt. %, preferably 0.5 to 5 wt. %.

If necessary, a surfactant or an organic solvent such as an alcohol can be added to the alkaline aqueous solution.

The following Preparation Examples and Examples will further illustrate the present invention, which by no means limit the scope of the present invention.

PREPARATION EXAMPLE 1

Preparation of N-hydroxyphthalimide-p-styrenesulfonate (Compound I—2):

50 ml of acetone was added to 3.3 g of N-hydroxyphthalimide and 4.1 g of p-styrenesulfonyl chloride. 2.0 g of triethylamine was dropwise added to the mixture under stirring at room temperature (about 20° C.). The mixture was stirred at room temperature for additional 1 hr. and poured into 200 g of ice/water. The precipitate thus formed was recrystallized from a solvent mixture of benzene/ethanol to obtain 4.6 g of N-hydroxyphthalimide-p-styrenesulfonate.

PREPARATION EXAMPLE 2

Preparation of N-hydroxyl-1,8-naphthylimide-p-styrenesulfonate (Compound I—4):

50 ml of acetone was added to 4.3 g of N-hydroxy-1,8-naphthylimide and 4.1 g of p-styrenesulfonyl chloride and then the same procedure as that of Preparation Example 1 was repeated to obtain 6.1 g of N-hydroxy-1,8-naphthylimide-p-styrenesulfonate.

PREPARATION EXAMPLE 3

Preparation of N-hydroxy-2-phenylsuccinimide-p-styrenesulfonate (Compound II—3):

50 ml of acetone was added to 3.8 g of N-hydroxy-2-phenylsuccinimide and 4.1 g of p-styrenesulfonyl chloride and then the same procedure as that of Preparation Example 1 was repeated to obtain 4.3 g of N-hydroxy-2-phenylsuccinimide-p-styrenesulfonate.

PREPARATION EXAMPLE 4

Preparation of o-(4-vinyl-1-naphthalenesulfonyl)-N-benzoyl-N-methylhydroxylamine (Compound III—9):

10.0 g of N-methylhydroxylamine hydrochloride was added to 100 ml of tetrahydrofuran. 19.8 g of pyridine was added to the mixture. A solution of 16.8 g of benzoyl chloride in 100 ml of tetrahydrofuran was dropwise added to the mixture under stirring at room temperature over 1 hr. The stirring was continued at room temperature for additional 8 hr. to conduct the reaction. 50 ml of dilute hydrochloric acid was added thereto and then tetrahydrofuran was removed under reduced pressure. After extraction with ethyl acetate, the extract was dehydrated over anhydrous magnesium sulfate. Ethyl acetate was removed under reduced pressure. The resultant crude product was purified according to column chromatography (packing: silica gel, developer: ethyl acetate/hexane) to obtain 8.5 g of N-benzoyl-N-methylhydroxylamine as an oil having a melting point of 20° C. or below. 130 ml of tetrahydrofuran was added to 7.6 g of N-benzoyl-N-methylhydroxylamine and 12.6 g of 4-vinyl-1-naphthalenesulfonyl chloride. A solution of 5.1 g of triethylamine in 20 ml of tetrahydrofuran was dropwise added thereto under stirring over 2 hr. while the mixture was cooled so that the temperature of the solution was below 25° C. After conducting the reaction at 15° to 25° C. for additional 2 hr., the reaction solution was poured into 700 ml of water and the precipitate thus formed was collected by filtration. After recrystallization from acetonitrile, 12.8 g of o-(4-vinyl-1-naphthalenesulfonyl)-N-benzoyl-N-methylhydroxylamine was obtained.

PREPARATION EXAMPLE 5

Preparation of N-hydroxymaleimide-1-naphthalenesulfonate (Compound IV–8):

120 ml of acetone was added to 5.7 g of N-hydroxymaleimide and 11.3 g of 1-naphthalenesulfonyl chloride and then the same procedure as that of Preparation Example 1 was repeated to obtain 10.9 g of N-hydroxymaleimide-1-naphthalenesulfonate.

EXAMPLES 1 TO 4

An aluminum sheet having a thickness of 0.24 mm was degreased by immersing it in a 10% aqueous solution of sodium tertiary phosphate for 3 min. Then, the sheet was grained with a nylon brush, etched with sodium aluminate for about 10 min. and desmutted with a 3% aqueous solution of sodium hydrogensulfate. The aluminum sheet was subjected to anodic oxidation in a 20% sulfuric acid solution at a current density of 2 A/dm$^2$ for 2 min.

Four kinds of sensitive solutions [A]-1 to [A]-4 were prepared by varying the kind of the polymeric compound of the present invention in the composition of Sensitive solution [A] shown below. The sensitive solution was applied to the aluminum sheet treated by the anodic oxidation as described above and then dried at 100° C. for 2 min. to prepare the respective photosensitive lithographic printing plates [A]-1 to [A]-4. The amount of the solution applied was 1.5 g/m$^2$ on dry basis in all the cases.

| Sensitive solution [A] | |
| --- | --- |
| Cresol/formaldehyde/novolak resin | 1.1 g |
| Polymeric compound of the present invention comprising a monomer unit of the general formula (I), (II), (III) or (IV) | 0.40 g |
| Oil blue #603 (a product of Orient Kagaku Kogyo Co., Ltd.) | 0.01 g |
| Methyl ethyl ketone | 5 g |
| Methyl cellosolve | 15 g |

The polymeric compounds of the present invention used for the preparation of the sensitive solutions [A]-1 to [A]-4 are shown in Table 1. They were polymers prepared from a monomeric compound of the general formula: (I), (II), (III) or (IV), styrene and maleimide in a molar ratio of 30:10:60. The weight average molecular weights of them were in the range of 15,000 to 35,000 (GPC, polystyrene standard).

TABLE 1

| Example | Photosensitive lithographic printing plate | Monomer of the present invention represented by the general formula (I), (II), (III) or (IV) |
| --- | --- | --- |
| 1 | [A]-1 | Compound (I-2) |
| 2 | [A]-2 | Compound (II-8) |
| 3 | [A]-3 | Compound (III-9) |
| 4 | [A]-4 | Compound (IV-8) |

A gray scale having a density gradient of 0.15 was firmly attached to the photosenitive layer of each of the photosensitive lithographic printing plates [A]-1 to [A]-4 and exposed to light of a 2 KW high-pressure mercury lamp from a distance of 50 cm for 2 min. The exposed photosensitive lithographic printing plates [A]-1 to [A]-4 were immersed in an aqueous solution of DP-4 (a traded name of Fuji Photo Film Co., Ltd.) diluted to ⅛ concentration at 25° C. for 60 sec. to develop a clear blue positive image.

EXAMPLES 5 TO 8

Photosensitive lithographic printing plates [B]-1 to [B]-4 were prepared in the same manner as that of Examples 1 to 4 except that the following sensitive solutions [B]-1 to [B]-4 were prepared by adding 0.05 g of ethyl Michler's ketone [4,4'-bis(diethylamino)benzophenone] as a sensitizer to the sensitive solutions [A]-1 to [A]-4 used in Examples 1 to 4, respectively. The amount of the coating was 1.5 g/m$^2$ on dry basis in all the cases.

| Sensitive solution [B] | |
| --- | --- |
| Cresol/formaldehyde/novolak resin | 1.1 g |
| Polymeric compound of the present invention comprising a monomer unit of the general formula (I), (II), (III) or (IV) (the same as that of Example 1, 2, 3 or 4) | 0.40 g |
| Ethyl Michler's ketone | 0.05 g |
| Oil blue #603 (a product of Orient Kagaku Kogyo Co., Ltd.) | 0.01 g |
| Methyl ethyl ketone | 5 g |
| Methyl cellosolve | 15 g |

After the exposure followed by the development of the photosensitive lithographic printing plates [B]-1 to [B]-4 conducted in the same manner as that of Examples 1 to 4, a clear blue positive image was obtained. The relative sensitivities of the photosensitive lithographic printing plates [B]-1 to [B]-4 to the photosensitive lithographic printing plates [A]-1 to [A]-4 obtained in Examples 1 to 4 were calculatred from the number of the stages in the clear part of the gray scale. The results are shown in Table 2.

TABLE 2

| Example | Photosensitive lithographic printing plate | Monomer of the present invention represented by the general formula (I), (II), (III) or (IV) | Relative sensitivity ratio [B]/[A] |
| --- | --- | --- | --- |
| 5 | [A]-1 [B]-1 | Compound (I-2) | 3.5 |
| 6 | [A]-2 [B]-2 | Compound (II-8) | 1.5 |
| 7 | [A]-3 [B]-3 | Compound (III-9) | 2.0 |
| 8 | [A]-4 [B]-4 | Compound (IV-8) | 1.5 |

It is apparent from Table 2 that the sensitivity was remarkably improved by the addition of ethyl Michler's ketone in all the cases.

What is claimed is:

1. A positive working photosensitive composition containing a polymeric compound comprising at least 1 molar % of a structural unit derived from at least one of monomers having the following general formulae (I), (II), (III) and (IV):

$$CH_2=C\begin{array}{c}R_1\\ \diagdown\\ Ar_1-SO_2-O-N\end{array}\begin{array}{c}O\\ \|\\ C\\ \diagup\ \diagdown\\ \diagdown\ \diagup\\ C\\ \|\\ O\end{array}Ar_2 \quad (I)$$

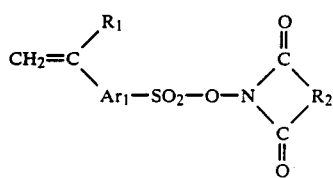 (II)

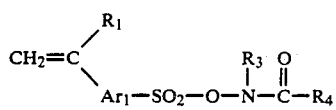 (III)

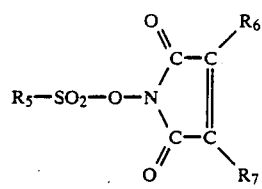 (IV)

wherein:

$R_1$ represents a hydrogen atom, an alkyl group or a substituted alkyl group, $R_2$ represents a divalent alkylene group or a substituted divalent alkylene group, $R_3$, $R_4$ and $R_5$ may be the same as or different from each other and each represents an alkyl group, a substituted alkyl group, an aryl group or a substituted aryl group, $R_6$ and $R_7$ may be the same as or different from each other and each represents a hydrogen atom, an alkyl group, a substituted alkyl group, an aryl group or a substituted aryl group, $Ar_1$ represents a single bond or $Ar_2$, and $Ar_2$ represents a divalent arylene group or a substituted divalent arylene group.

2. The composition of claim 1, wherein said $R_1$ represents a hydrogen atom, an alkyl group having 1 to 3 carbon atoms, or an alkyl group having 1 to 3 carbon atoms and substituted with a halogen atom or an alkoxy group having 1 to 6 carbon atoms.

3. The composition of claim 1, wherein said $R_2$ represents a straight divalent alkylene group having 1 to 18 carbon atoms or a straight divalent alkylene group having 1 to 18 carbon atoms and substituted with a halogen atom, an alkoxy group having 1 to 6 carbon atoms or an aryloxy group having 6 to 10 carbon atoms.

4. The composition of claim 1, wherein said $R_3$, $R_4$ or $R_5$ represents an alkyl group having 1 to 10 carbon atoms, an alkyl group having 1 to 10 carbon atoms and substituted with a halogen atom, an alkoxy group having 1 to 6 carbon atoms, an aryl group or an aryloxy group, a monocyclic or bicyclic aryl group, or a monocyclic or bicyclic aryl group substituted with an alkyl group having 1 to 6 carbon atoms, an alkoxy group having 1 to 6 carbon atoms, a halogen atom, a phenyl group, a carboxy group or a cyano group.

5. The composition of claim 1, wherein said $R_6$ or $R_7$ represents a hydrogen atom, an alkyl group having 1 to 10 carbon atoms, an alkyl group having 1 to 10 carbon atoms and substituted with a halogen atom, an alkyl group having 1 to 6 carbon atoms, an alkoxy group having 1 to 6 carbon atom or a nitrile group, a monocyclic or bicyclic ary group, or a monocyclic or bicyclic ary group substituted with a halogen atom, an alkyl group having 1 to 6 carbon atoms, an alkoxy group having 1 to 6 carbon atoms or a nitrile group.

6. The composition of claim 1, wherein said $Ar_1$ represents a single bond, a monocyclic or bicyclic arylene group, or a monocyclic or bicyclic arylene group substituted with an alkyl group having 1 to 6 carbon atoms, an alkoxy group having 1 to 6 carbon atoms, a halogen atom, a pheny group, a carboxy group, or a cyano group.

7. The composition of claim 1, wherein said $Ar_2$ represents a monocyclic or bicyclic arylene group, or a monocyclic or bicyclic arylene group substituted with an alkyl group having 1 to 6 carbon atoms, an alkoxy group having 1 to 6 carbon atoms, a halogen atom, a pheny group, a carboxy group, or a cyano group.

8. The composition of claim 1, wherein the monomer having the general formula (I) is selected from the group consisting of:

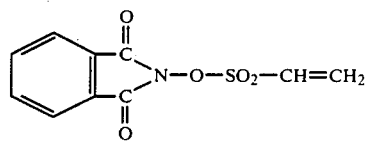 (I-1)

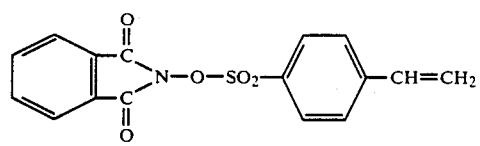 (I-2)

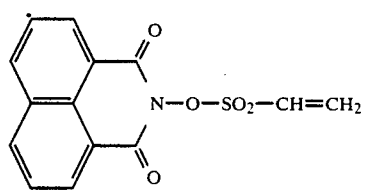 (I-3)

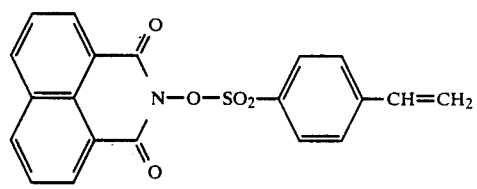 (I-4)

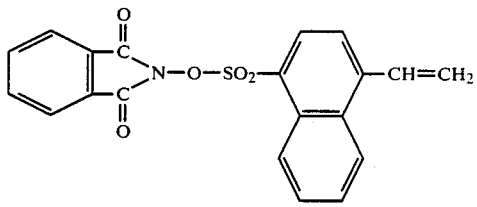 (I-5)

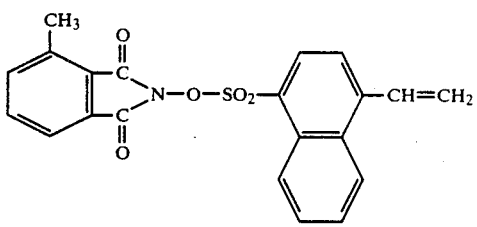 (I-6)

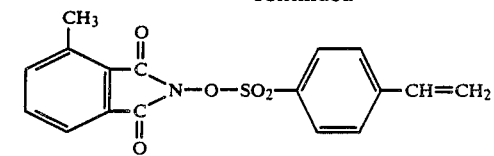 (I-7)
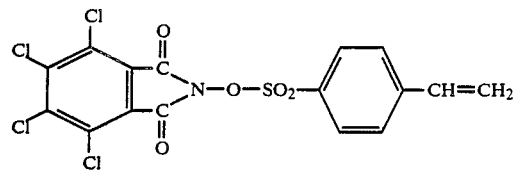 (I-8)
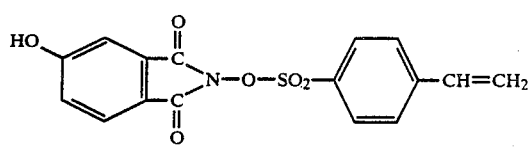 (I-9)
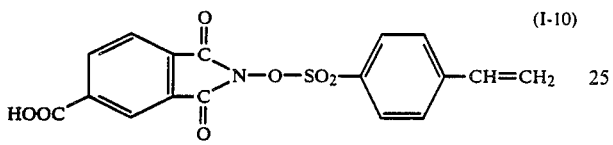 (I-10)
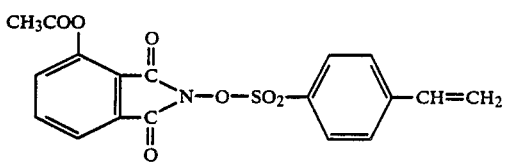 (I-11)
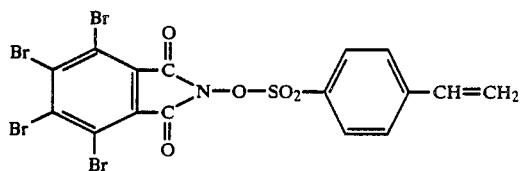 (I-12)
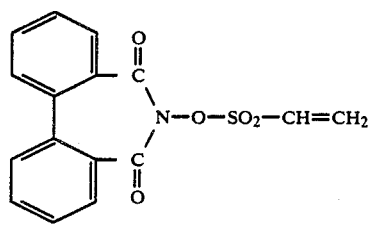 (I-13)
and
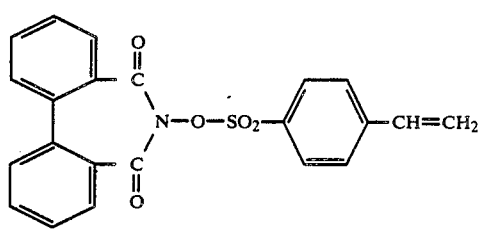 (I-14)
9. The composition of claim 1, wherein the monomer having the general formula (II) is selected from the group consisting of:
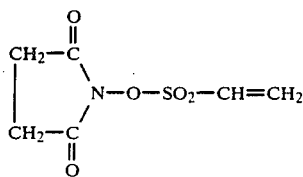 (II-1)
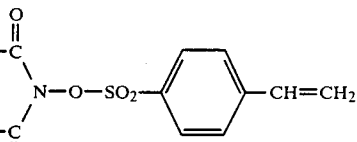 (II-2)
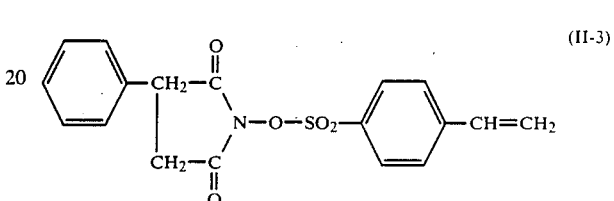 (II-3)
 (II-4)
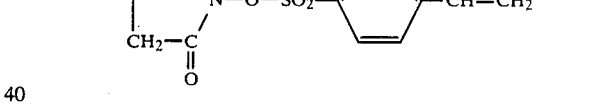 (II-5)
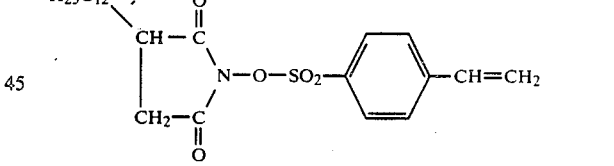 (II-6)
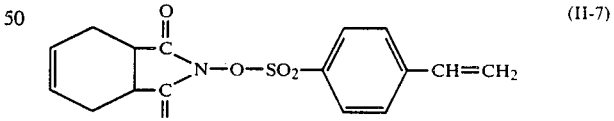 (II-7)
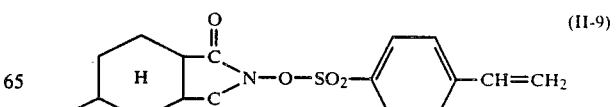 (II-8)
 (II-9)

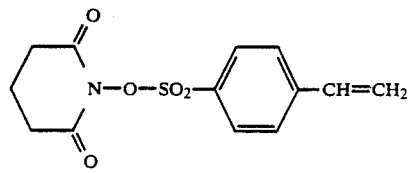 (II-10)
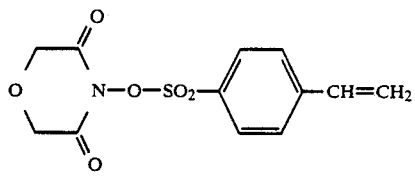 (II-11)
and
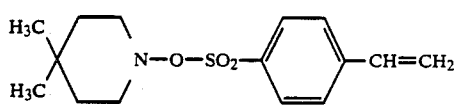 (II-12)
10. The composition of claim 1, wherein the monomer having the general formula (III) is selected from the group consisting of:
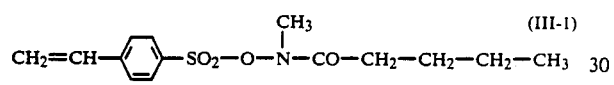 (III-1)
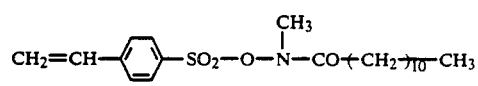 (III-2)
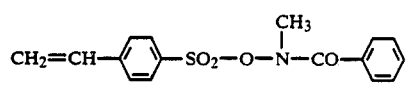 (III-3)
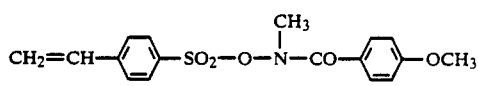 (III-4)
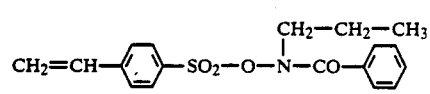 (III-5)
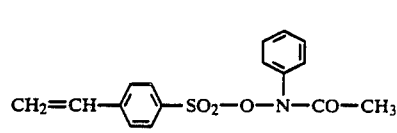 (III-6)
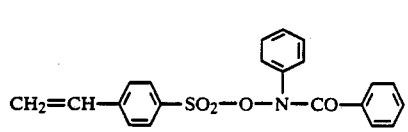 (III-7)
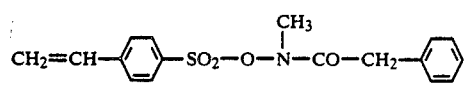 (III-8)
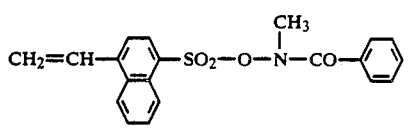 (III-9)
and
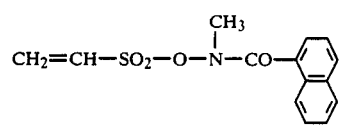 (III-10)
11. The composition of claim 1, wherein the monomer having the general formula (IV) is selected from the group consisting of:
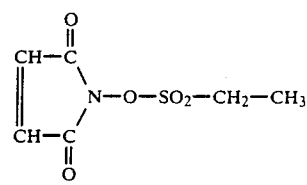 (IV-1)
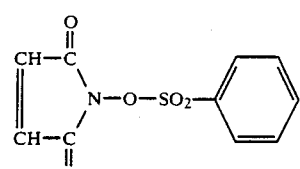 (IV-2)
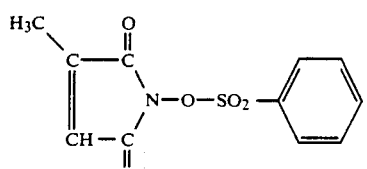 (IV-3)
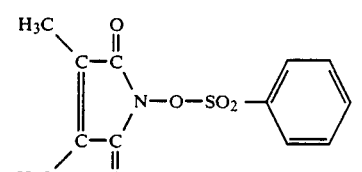 (IV-4)
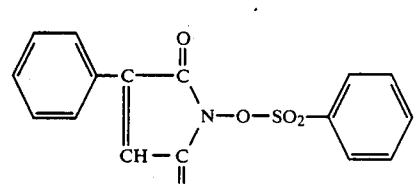 (IV-5)
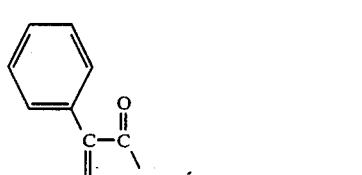 (IV-6)

-continued

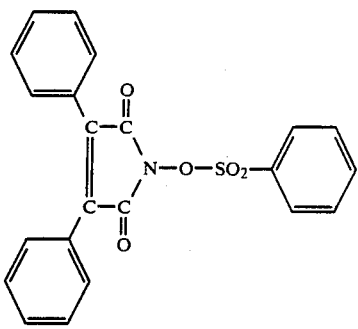 (IV-7)

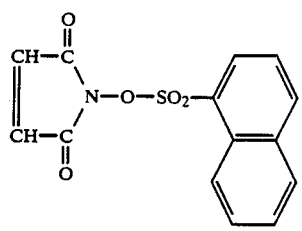 (IV-8)

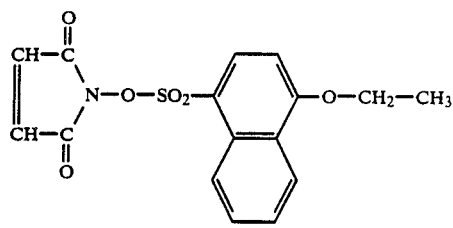 (IV-9)

and

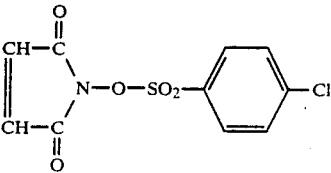 (IV-10)

12. The composition of claim 1, wherein the weight average molecular weight of said polymeric compound is at least 1000.

13. The composition of claim 12, wherein the weight average molecular weight of said polymeric compound is 5000~1,000,000.

14. The composition of claim 1, wherein said polymeric compound is contained in an amount of 1~100 wt. %.

15. The composition of claim 14, wherein said polymeric compound is contained in an amount of 3~70 wt. %.

16. The composition of claim 14, wherein said polymeric compound is contained in an amount of 5~50 wt. %.

17. The composition of claim 1, wherein said polymeric compound contains a unit derived from a monomer having a copolymerizable ethylenically unsaturated bond.

18. The composition of claim 1 further comprising a sensitizer.

19. The composition of claim 18, wherein said sensitizer is selected from the group consisting of benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino) benzophenone and benzanthrone.

20. The composition of claim 19, wherein said sensitizer is Michler's ketone.

* * * * *